US006844726B2

(12) United States Patent
Leger et al.

(10) Patent No.: US 6,844,726 B2
(45) Date of Patent: Jan. 18, 2005

(54) VECTOR MEASUREMENT OF A MAGNETIC FIELD

(75) Inventors: Jean-Michel Leger, Villard Bonnot (FR); Olivier Gravrand, Grenoble (FR); François Bertrand, Tronche (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/399,256

(22) PCT Filed: Oct. 17, 2001

(86) PCT No.: PCT/FR01/03212

§ 371 (c)(1),
(2), (4) Date: Sep. 16, 2003

(87) PCT Pub. No.: WO02/33434

PCT Pub. Date: Apr. 25, 2002

(65) Prior Publication Data

US 2004/0046553 A1 Mar. 11, 2004

(30) Foreign Application Priority Data

Oct. 18, 2000 (FR) .............................. 00 13328

(51) Int. Cl.[7] ................................................ G01V 3/00
(52) U.S. Cl. ..................................... 324/300; 324/302
(58) Field of Search .............................. 324/300, 302, 324/304, 251, 261, 345, 307

(56) References Cited

U.S. PATENT DOCUMENTS

| 3,828,243 | A | | 8/1974 | Ward ........................... 324/0.5 |
| 5,221,897 | A | | 6/1993 | Duret et al. ................. 324/302 |
| 5,239,474 | A | * | 8/1993 | Eaton et al. ........... 324/207.14 |
| 5,534,776 | A | | 7/1996 | Leger et al. ................. 324/304 |
| 6,313,628 | B1 | * | 11/2001 | Leger .......................... 324/300 |
| 6,476,610 | B1 | * | 11/2002 | Wiegert et al. ............. 324/345 |
| 6,714,008 | B1 | * | 3/2004 | Holmes et al. ............. 324/261 |
| 2004/0085065 | A1 | * | 5/2004 | Johnson et al. ............. 324/251 |

FOREIGN PATENT DOCUMENTS

| EP | 0964260 A1 | 12/1999 | ........... G01R/33/26 |
| FR | 1354208 | 6/1964 | |
| FR | 2155981 | 10/1972 | ........... G01R/33/00 |
| FR | 2 663 431 A1 | 6/1990 | ........... G01R/33/26 |

OTHER PUBLICATIONS

J.M.G. Merayo, F. Primdahl, P. Brauer, The Orthogonalization of Magnetic Systems, Jan. 11, 2000.
Preliminary Search Report; dated Jun. 27, 2001.

* cited by examiner

*Primary Examiner*—Brij B Shrivastav
(74) *Attorney, Agent, or Firm*—Thelen Reid & Priest, LLP

(57) ABSTRACT

A vectorial magnetometer (1), measures the components of a magnetic field in three directions (Oxyz) using a scalar magnetometer (2). The field is periodically modulated in each of the directions by generators (Gx, Gy, Gz) which have a specific frequency for each direction and that power coils (Ex, Ey, Ez). Synchronous demodulation of the of the output signal of the scalar magnetometer (2) for each of the three frequencies permits the relative continuous component of each axis to be found. The vectorial magnetometer (1) is characterized in that it has means (Dx D'x, Dy D'y, Dz D'z) that can carry out a double demodulation for phase and quadrature for each of the frequencies and processing means (70) that use the continuous component modules for phase and quadrature to calculate a transfer function of the scalar magnetometer at the frequency in question, and to apply this function to the correction of the components.

15 Claims, 2 Drawing Sheets

VECTOR MEASUREMENT OF A MAGNETIC FIELD

CROSS REFERENCE TO RELATED APPLICATIONS

This application claims priority based on International Patent Application No. PCT/FR01/03212, entitled "Improved Vectorial Measurement of a Magnetic Field" by Jean-Michel Leger et al., which claims priority of French Patent Application Serial No. 00/13328, filed on Oct. 18, 2000.

TECHNICAL FIELD

This invention concerns a device and a procedure for measuring the components of a magnetic field using a scalar magnetometer. It has an application in the measurement of small magnetic fields (of a grandeur similar to that of the Earth's magnetic field, which is to say a few tens of microteslas) that need to be obtained with great precision, of around $10^{-5}$.

STATE OF THE PRIOR TECHNIQUE

For a number of years, work has been consecrated to the vectorial measurement of magnetic fields using magnetometers that are intrinsically scalar, which is to say only sensitive to the magnetic field module, independently of its direction. The underlying idea behind this work is to take advantage of the absolute nature of the scalar measurements (based on proton (RMN) or electron (RPE) resonance to overcome one of the main disadvantages of vectorial sensors, which is to say their offsets and the associated low frequency derivatives.

Such a creation is described for example in patent No. FR-A-2 663 751 or in its American equivalent U.S. Pat. No. 5,221,897. These documents contain, among others, bibliographical references on the subject.

A vectorial magnetometer using such a scalar magnetometer and capable of supplying the values of each of the components of the magnetic field vector, and whose module is provided by the scalar magnetometer is described in the patent application FR 9807216.

According to the invention described in this patent application, the device for measuring the components of the magnetic field include among others a scalar magnetometer supplying an output signal which corresponds to the module of an applied magnetic field:

at least two conductor coils positioned around the said scalar magnetometer, the axes of these conductor coils being orientated in different directions (Ox, Oy, Oz).

means for powering each coil with a current with a determined frequency (Fx, Fy, Fz) specific to this coil, processing means that receive the signal provided by the scalar magnetometer, these means being capable of carrying out synchronous demodulations, at least at the frequencies (Fx, Fy, Fz) of the currents powering the coils, these processing means providing, for each frequency, a signal corresponding to the component (Bx, By, Bz) of the magnetic field applied along the axis (Ox, Oy, Oz) of the coil powered at this frequency.

The analysis of the signal induced by each of the coils permits the component of the magnetic field vector of the module $B_o$ projected onto this axis to be found.

Furthermore, an article by J. M. G. MERAYO, F. PRIMDAHL AND P. BRAUER submitted on Jan. 21, 2000 to the participants of the first "Workshop for calibration of the magnetic field of the Earth" held at Saclay (1) and entitled "the orthogonalisation of magnetic systems" explains how to change from a real axial system, in principle orthonormal but necessarily biased, which is to say orthonormal or close to an orthonormal system, to a truly reconstructed orthonormal axis system, and how to calculate the components of a magnetic field vector in the orthonormal axis system reconstructed from the measurements obtained from the magnetic axes of the coils. A device capable of making such a change of axes may also include the means for calculating the axis change matrices, sensors dedicated to this function. The calculation may also be made from the readings made by each of the two other coils from a field emitted by one of the coils.

BRIEF DESCRIPTIONS OF THE INVENTION

Studies carried out by the inventor have revealed the presence of a residue, which is to say a difference that is not nil, between the direct measurement of the module value of the magnetic field vector obtained by the scalar magnetometer and the calculated value of this module based on its three components, which are obtained by synchronous demodulation at each of the field modulation frequencies.

FIG. 1 part A shows two curves. The first curve marked a represents the evolution in time of the module value of the magnetic field vector obtained by the scalar sensor. A second curve shown in solid lines marked b represents the evolution in time of this module value calculated from the three components obtained by the analysis of the signals from each of the three coils.

FIG. 1 part B shows on an enlarged scale for the ordinates, the evolution in the same time of the difference dB between the module values obtained by direct measurement and by calculation.

On this figure, the ordinates are graduated in nT and show a difference varying between −15 nT and +10 nT. It is therefore concluded that the measurement of the components using the method known in the prior art does not allow accuracy of the order of $10^{-5}$ to be obtained, and that consequently the measuring device and method need to be improved to reach this objective.

The invention therefore concerns a device and a procedure for measuring the components of a magnetic field to around $10^{-5}$.

The hypothesis retained to improve the known process described in the patent application FR 98 07216 mentioned above, is that the transfer function $f_{transfer}$ permitting the passage from the measurement to a frequency, for example Fx along the Ox axis to the field component in this direction Ox, is equal to the product of a function of the said frequency Fx by a function depending on the measurement instrument used, which will be called $f_{instrument}$.

The reason for this hypothesis is as follows. The operation in vectorial mode is based on the analysis of the response of the scalar magnetometer to a periodic mode stimulation at each of the frequencies Fx, Fy and possibly Fz. The result is that any modification of the of the transmission band of the scalar magnetometer affects the previously determined transfer functions in a significant way when an accuracy of around $10^{-5}$ is sought.

The transmission band is a result of the different physical phenomena used in the scalar probe. For a scalar magnetometer with optical helium pumping, in compliance with the document FR-A-2 713 347 previously mentioned (or its American equivalent U.S. Pat. No. 5,534,776) it depends in particular on the relaxation time of the atoms in the metastable level which varies with the temperature proportionally to $1/\sqrt{T}$ and with the current of the electrical field with high frequency discharge maintenance, of the pumping time which depends on the intensity of the laser beam, or even the time constant characteristic of the magnetic resonance which is a function of the radio-frequency field.

Therefore, according to the invention, it is accepted that:

$$f_{instrument} * H(F) = f_{transfer}$$

The instrumental function $f_{instrumental}$ which depends on the known characteristics of the instrument is known to within $10^{-5}$. According to the invention, the transfer function H(F) remains to be determined for each frequency Fx, Fy or Fz.

If an initial estimation is made that the transmission band of the scalar sensor is similar to a low pass filter of the first order:

$$H(F) = \frac{1}{1 + i\frac{F}{F_o}}$$

where $F_o$ is the filter cut off frequency.

The module of this transfer function can therefore be described by:

$$|H(F)| = \frac{1}{\sqrt{1 + \left(\frac{F}{F_o}\right)^2}}$$

In the case of a small frequency preceding the cut off frequency of this filter, the module is developed in the second order:

$$|H(F)|\underset{F \ll F_o}{\cong} 1 - \frac{1}{2}\left(\frac{F}{F_o}\right)^2 + o\left(\frac{F_o}{F}\right)^4$$

giving a relative fluctuation proportional to the relative fluctuations of $F_o$:

$$\frac{\Delta|H|}{|H|}\underset{F \ll F_o}{\cong} \frac{\left(\frac{F}{F_o}\right)^2}{1 - \frac{1}{2}\left(\frac{F}{F_o}\right)^2}\frac{\Delta F_o}{F_o}\underset{F \ll F_o}{\cong} \left(\frac{F}{F_o}\right)^2\frac{\Delta F}{F_o} \quad (4)$$

The fluctuations of these transfer functions are therefore proportional to those of the transmission band of the helium scalar sensor, with the proportionality factor depending on $F^2$. Consequently, the scalar residue varies proportionally to the fluctuation of the transmission band:

$$\Delta(dB_a) \cong \Delta\left(\sqrt{\sum_{i=x,y,z}\left(H(F_i)\frac{B_oH_{li}}{b_{mi}}\right)^2}\right) \cong 2\frac{\sum_{i=x,y,z}\frac{B_oH_{li}}{b_{mi}}H(F_l)\left(\frac{F_{li}}{F_o}\right)^2 1}{\sum_{i=x,y,z}\left(H(F)\frac{B_oH_{li}}{b_{mi}}\right)^2}\frac{\Delta F_o}{F_o}$$

Furthermore, the phase of this filter is given by the expression:

$$\varphi(F) = -\arctan\left(\frac{F}{F_o}\right)$$

For a frequency close to the continuum, we can write:

$$\varphi(F) = -\frac{F}{F_o} + o\left(\frac{F}{F_o}\right)^3$$

For $F \ll F_o$, it can be deduced that a fluctuation $\Delta F_o$ of the band of the scalar sensor therefore gives rise to a fluctuation $\Delta\varphi$ of the phase such that:

$$\frac{\Delta\varphi}{\varphi}\underset{F \ll F_o}{\cong} -\frac{\Delta F_o}{F_o}$$

By examining the parallel evolutions of the scalar residue dB and the phases of the harmonics (as the third projection in the experimental configuration retained was almost nil, the corresponding signal phase has not been shown) during the recording shown in FIG. 2, it can be remarked that the phases $\phi_x$ and $\phi_y$ of the two components x and y fluctuate in correlation with the evolutions of dB, shown in FIG. 1 in compliance with the modelling results.

The proposed method consists of taking into account the fluctuations of the transmission band of the scalar magnetometer by using the information contained in the signal phases generated by one or more of the modulations.

However, instead of a single synchronous detection for each modulation as in the patent application FR 98 07216 previously mentioned, a double synchronous detection in phase and in quadrature is carried out, which makes possible the simultaneous detection of the amplitude M and the phase $\phi$ of each signal in function of the modules in phase P and in quadrature Q, $M=(P^2+Q^2)^{1/2}$ and $\phi=\text{Arct}(Q/P)$.

The phase measurement makes possible an estimation of the cut of frequency $F_o$ of the magnetometer which is then used to correct the transfer function module H(F) at the frequency in question.

Thus a device for measuring the magnetic field components, improved according to the invention, will include all of the elements described in relation with the patent application FR 98 07 216 previously mentioned, but with at least one of the means to apply to at least one of the coils Ex, Ey, Ez, a first signal that will be modified to generate a second signal at the same frequency but offset in relation to one another. As in the prior art, the first signal will be applied to the coils Ex, Ey, Ez.

The detection means associated to each of the coils will be capable of not only detecting in phase, as in the prior art, but also in compliance with the invention, detecting in quadrature. To this end, they will receive the second signals offset with respect to the first signals. The calculation means will include, in compliance with the invention, means for calculating the phase of the scalar magnetometer transfer function for at least one of the frequencies applied to a coil, and the module of this function.

In summary, the invention concerns a precision device for measuring the components of the magnetic field using a scalar magnetometer supplying an output signal corresponding to the module of an applied magnetic field and comprising:

at least two conductor coils positioned around the said scalar magnetometer, the axes of these conductor coils being orientated in different directions (Ox, Oy, Oz).

means for powering each coil with a current with a determined frequency (Fx, Fy, Fz) specific to this coil, processing means that receive the signal provided by the scalar magnetometer, and processing this signal to deduce the value of the continuous component along each of the axes of the coils.

device characterised in that at least one of the means that power each coil with a current of a determined frequency (Fx, Fy, Fz) specific to each coil, produce at this frequency signals in phase and in quadrature, in that the processing means which receive the signal provided by the scalar magnetometer are capable of carrying out, apart from a synchronous demodulation in phase at least at the frequencies (Fx, Fy, Fz) powering the coils, a demodulation in quadrature for at least one of the frequencies (Fx, Fy, Fz) of the currents powering the coils (Ex, Ey, Ez), these demodulation means receiving, apart from the signal in phase generated by the power supply of the coils (Ex, Ey, Ez), the signal in quadrature from the generation means (Gx, Gy, Gz) and finally in that these processing means include a calculation module that provides, based on the results of the different demodulations, for each frequency, a signal corresponding to the corrected component (Bxc, Byc, Bzc) of the magnetic field applied along the axis (Ox, Oy, Oz) of the coil (Ex, Ey, Ez) powered at this frequency.

In practice, a device of the prior art could be modified by adding to at least one of the generators (Gx, Gy, Gz) to supply each coil with a current of a determined frequency (Fx, Fy, Fz) specific to this coil, a quarter of a wave delay. Therefore one coil, Ex for example, would be powered by a direct output from the generator. However, the demodulation means will receive, apart from the direct output, a parallel output in quadrature.

The software programmes of the processing means will be modified on the one hand to carry out a synchronous demodulation, in phase and in quadrature, on at least one of the specific frequencies of each axis and to calculate a correction of the value of the continuous component along each of the axes, taking into account the results of this double demodulation.

In one embodiment, there is a coil for each axis, and three generators Gx, Gy and Gz. These three generators are each equipped with a quarter wave delay. Each of the three generators is coupled to a coil and a demodulator carrying out a phase demodulation. Each of the delays is coupled to a demodulator carrying out a quadrature demodulation.

It is also possible to use only two quarter wave delays, and to calculate the transfer function solely for the frequencies respectively powering the coil Ex and the coil Ey, the transfer function for the third component being obtained indirectly from one of the two transfer functions obtained directly, preferably the one with the largest module.

The invention also concerns a process for measuring the components of a magnetic field along the axes (Ox, Oy, Oz), orientated in different directions, obtained using a device using a scalar magnetometer providing an output signal corresponding to the module $B_o$ of an applied magnetic field, the process consisting of superposing on the magnetic field to be measured, fields that are each orientated along each of the axes (Ox, Oy, Oz) respectively, these superposed fields varying in time periodically according to a frequency (Fx, Fy, Fz) that is specific to each axis, and then synchronously demodulating at each of the frequencies (Fx, Fy, Fz) the signal emitted from the scalar magnetometer and processing the signal resulting from a synchronous demodulation at one frequency, in order to deduce the value of the continuous component of the magnetic field along the axis receiving the superposed field at this frequency, a process characterised in that for at least one of the axial directions, the demodulation is carried out synchronously in phase and in quadrature for at least one of the superposed fields, and in that from the demodulation results at least one transfer function of the magnetometer is directly calculated for one of the frequencies at which a periodic field was superposed at this frequency, and possibly indirectly one or two transfer functions from a transfer function obtained directly and in that the value of the module of each component is corrected by application of one of the transfer functions calculated directly or indirectly.

Thus in general, a transfer function will be calculated directly or indirectly at each of these frequencies and each component will be corrected according to the transfer function calculated at the frequency corresponding to this component.

According to one embodiment of the process:
the uncorrected components of the magnetic field are calculated;
a comparison is made of the components to determine which is the largest;
the correction is made by applying to each axial component the transfer function corresponding to the frequency modulation applied to the coil along the axis of this axial component, the transfer functions of the largest component being obtained directly from the demodulation results, and the transfer function of the other components being obtained indirectly from the transfer function of the largest component.

According to one advantageous variant, a check will be made that the signals leading to the calculation of each transfer function according to the frequency have acceptable signal noise level ratios. In practice, the signal noise level will be acceptable if the level of the signal is higher than a predetermined threshold. Consequently, if the level is greater than this threshold, then the transfer function that is calculated directly for this frequency will be used. However, if the level of one of the signals is lower than this threshold, then the transfer function obtained directly at this frequency will be replaced by a transfer function obtained indirectly, which is to say calculated from a transfer function obtained directly for another frequency, preferably the frequency corresponding to the continuous component with the highest value.

We have seen earlier in an example relating to a low pass filter of the fist order, that the fluctuations of the transfer functions are proportional to those of the transmission band of the helium scalar sensor, the proportionality factor depending on $F^2$. It is therefore possible to calculate a transfer function at a second frequency if a transfer function is known for a first modulation frequency.

An example of such a calculation is given by: the formula (4) at the bottom of page 6 earlier in this document.

It should be noted that the cut off frequencies of the transfer functions are situated between 200 and 1,000 Hertz and in general around 400 Hertz, whereas the superposition field frequencies are chosen between 5 and 60 Hertz so that the values of these frequencies are always smaller than the cut off frequencies. The result is that the calculations may be simplified as indicated above, on pages 5 to 7, in particular by making developments limited for example to the first order. Also, as noted just above, the transfer functions at the different modulation frequencies may be calculated from one of them. This is why, when the demodulation data at a frequency has interference, it is better for that for this frequency with interference, that a transfer function be calculated based on a transfer function obtained for a different frequency in which the signal noise ratio is high.

Finally, sinusoidal periodic figures are preferably applied to the coils.

BRIEF DESCRIPTION OF THE DRAWINGS

FIG. 1 part A shows two curves. The first curve marked a represents the evolution in time of the module value of the magnetic field vector. A second curve marked b represents the evolution in the same time of this module value calculated from its three components. Part B represents the evolution in time of the value of the difference dB between the values of the two modules represented in part A.

DESCRIPTION OF A SPECIFIC EMBODIMENT

Figure 1:
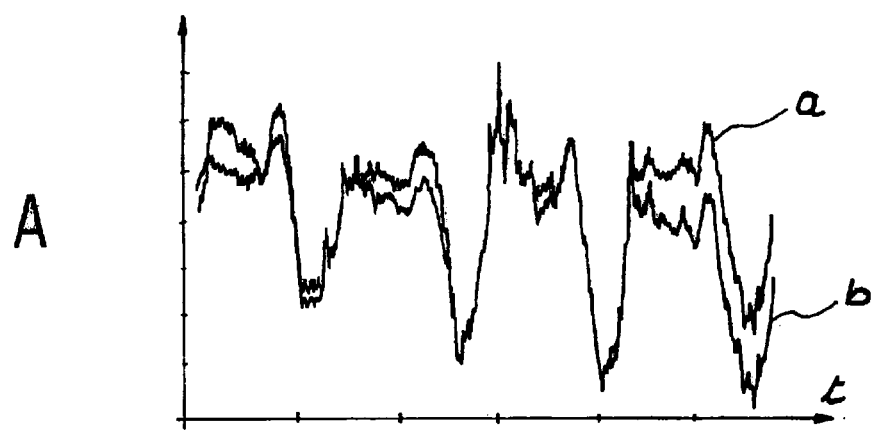
FIG. 1 which as already been described comprises parts A and B.
Figure 1:
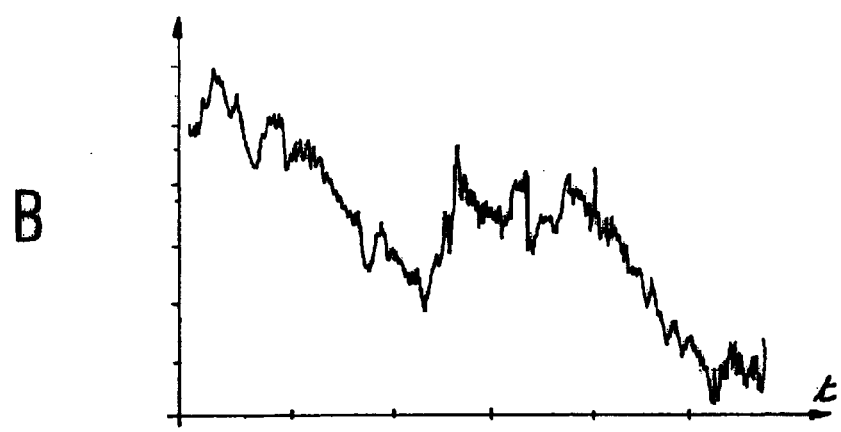
Figure 2:
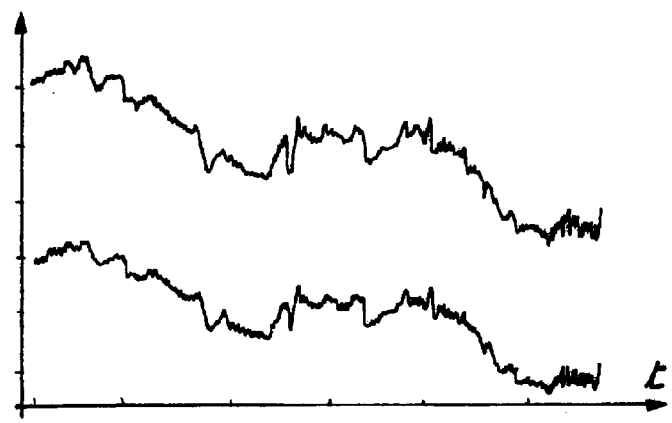
FIG. 2 which has already been described shows during the same time as the curves represented in FIG. 1 the curves of the evolution in time of the phase value of the two transfer functions corresponding to two superposition frequencies.
Figure 3:
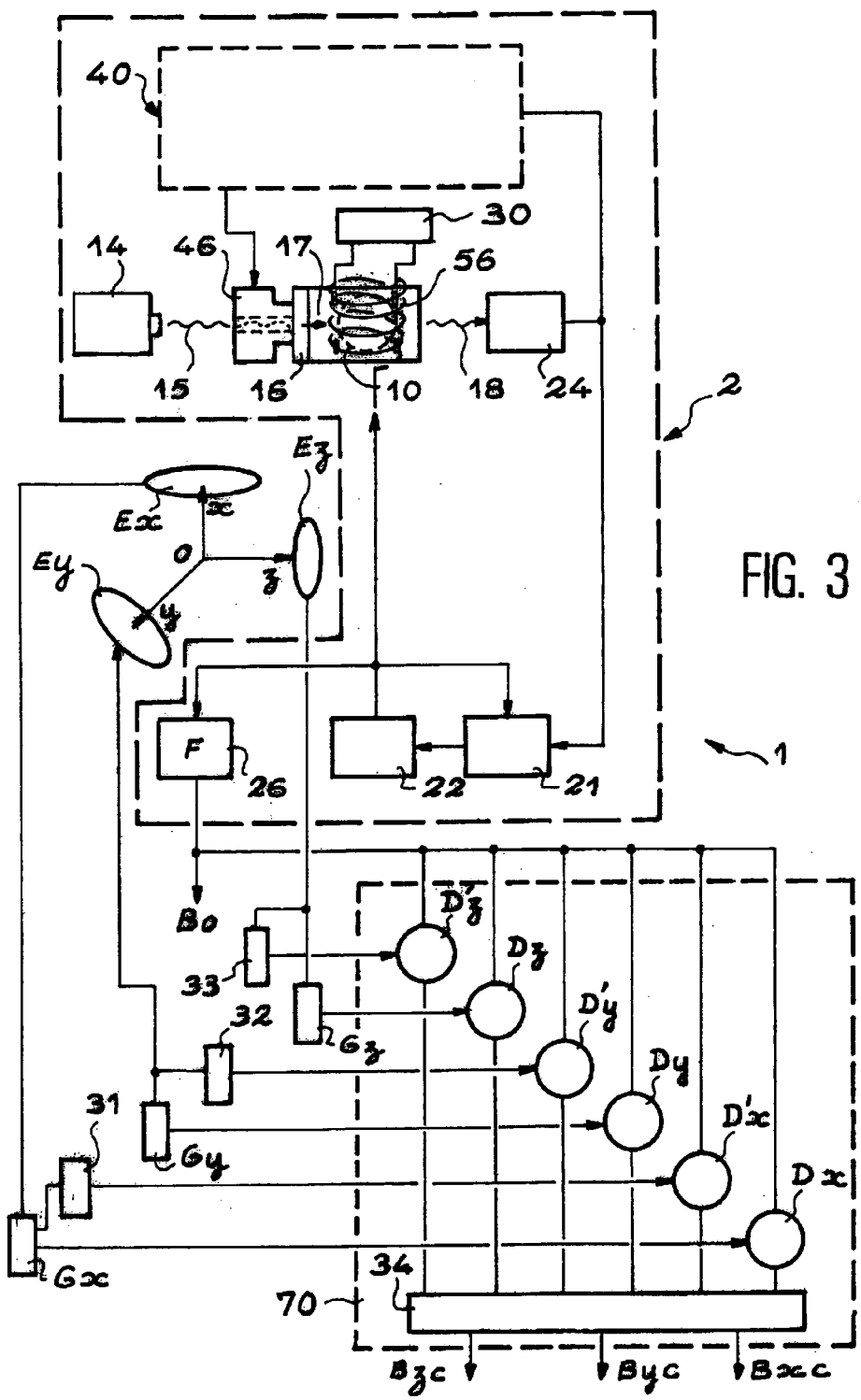
FIG. 3 illustrates an embodiment of a device according to the invention.

It can be seen, first of all in FIG. 3, a scalar magnetometer 2 with optical helium pumping, in compliance with the document FR-A-2 713 347 previously mentioned (or its American equivalent U.S. Pat. No. 5,534,776).

This magnetometer 2 comprises in a known manner a cell 10 filled with helium, a laser 14 emitting a beam 15, a polariser 16 supplying a rectilinear polarised beam 17, a photo-sensor 24 that receives: the beam 18 after it has passed through the cell 10, a frequency servo circuit 21, a radio-frequency generator 22, a frequency meter 26 and a discharge circuit 30. The generator 22 powers a coil 56 positioned close to the cell 10 in order to create a radio-frequency field in the latter. The coil 56 and the polariser 16 are mechanically held together, so that any rotation applied to the polariser causes a rotation of the same angle in the direction of the field, the intensity of the latter being defined by the generator 22.

Advantageously, to connect the means 26 and 16, a rotating contact is used, for example a capacity coupling contact or by a transformer whose primary coil is fixed and the secondary coil is mobile.

In preference, the coil 10 and the polariser 16 are mounted so that the polarisation and the field applied are parallel.

The circuit 40 is a servo circuit which controls a motor 46 that adjusts the angular position of the polariser 16. This circuit is described in the document mentioned.

In the embodiment illustrated, the device comprises three conductor coils, Ex, Ey and Ez, whose axes form a trihedron that is in principle trirectangular Oxyz. To make this easier to understand, these coils are shown distant from the cell 10 but, it should be understood that these coils surround the cell 10. Each of the coils Ex, Ey, Ez is connected to a generator, respectively Gx, Gy and Gz, each set to a specific modulation frequency $F_x$, $F_y$, $F_z$. The modulation frequencies $F_x$, $F_y$, $F_z$ are of course different from one another. In compliance with the invention, each generator Gx, Gy and Gz, is equipped with a quarter wave delay 31, 32, 33 respectively.

A processing circuit 70 comprises six demodulators, Dx, D'x, Dy, D'y, Dz, D'z, coupled respectively to the generators Gx, Gy and Gz and to the quarter wave delays 31, 32, 33 and which receive the output signal sent by the scalar magnetometer, which is to say, in the embodiment illustrated, the signal provided by the frequency meter 26. This signal is generally a digital signal providing the module Bo of the field to be measured.

The application of a external field Hx applied along the Ox axis at a frequency Fx modifies the module of the field to be measured by a quantity that varies at the frequency Fx. The output signal of the scalar magnetometer, which provides the field module, therefore contains a component that varies at the frequency Fx, the component representing the projection of the field to be measured on the Ox axis. The value of this projection depends among others as explained earlier in this document on the value of the transfer function of the magnetometer for this frequency. By demodulating the scalar magnetometer output signal in phase and in quadrature at the frequency Fx, then the value of this component can be identified and also the value of the module and the phase of the transfer function. It is thus possible to calculate a corrected value of the component on Ox. The same also applies for the two other components.

The demodulation part of the circuit 70 composed of the circuits Dx, D'x, Dy, D'y, Dz and D'z is typical and can operate either by multiplication and demodulation or by Fournier's fast transformation (FFT). It supplies the phase and quadrature Bx, B'x, By, B'y, Bz, B'z of the field to the components in the three directions Ox, Oy and Oz. These components are received in a calculation module 34 of the processing circuit 70. The module 34 calculates the transfer function for each frequency and corrects the value of the component for each axis depending on this transfer function to provide corrected components.

Advantageously, the calculation module 34 incorporates an axis change function to provide the values of each component of the field to an orthonormal trihedron calculated using one of the methods described by J. M. G. MERAYO, F. PRIMDAHL AND P. BRAUER already mentioned. In general, as explained in this article, an axis of the calculated orthonormal trihedron is merged with one of the axes of the coils. In the example described here, the parameters of the transformation matrices are calculated in a prior calibration phase identical in principle to the methods applied to the flux gates).

When the three corrected field components Bx, By and Bz are those recalculated in the calculated orthonormal identification, they are linked to the field module Bo by the relationship:

$$B_x^2 + B_y^2 + B_z^2 = B_o^2$$

It is also possible to use just two coils, for example Ex and Ey, two generators Gx and Gy and two demodulators Dx and Dy, to obtain the two components Bx and By and to find the third component Bz from the continuous value Bo given by the frequency meter 26. The relationship that gives Bz is obviously:

$$|Bz| = [B_o^2 - B_x^2 - B_y^2]^{1/2}$$

Naturally, the embodiment that we have just described is only given by way of example and another scalar magnetometer than the one described could be used, the essential aspect being that it provides an output signal reflecting the field module.

It is also possible to use just one quarter wave delay, for example 31, and to calculate the transfer function solely for the frequency powering the coil Ex, the transfer functions for the other two components being obtained indirectly from the sole transfer function obtained directly.

It has been shown above that the number of coils Ex, Ey and Ez can vary between two and three, that the number of quarter wave delays 31, 32, 32, can vary between one and three, and the result is that the number of synchronous detectors can vary between three and six. There are three of them if there are two generators and only one with a delay, and six for three generators each equipped with a delay.

It is better for the processing means 70 to have a number of synchronous detection means equal or at most equal to the total number of signal generators and the number of quarter wave delays 31–33 equipping: the said signal generators.

(1) The article by J. M. G. MERAYO, F. PRIMDAHL, AND P. BRAUER submitted on Jan. 21, 2000 to the participants of the first "Workshop for calibration of the magnetic field of the Earth" held at Saclay and entitled "the orthogonalisation of magnetic systems" should be published in the magazine "Sensors and actuators".

What is claimed is:

1. Precision device (1) for measuring the components of the magnetic field comprising:

a scalar magnetometer (2) supplying an output signal corresponding to the module of an applied magnetic field:

at least two conductor coils (Ex, Ey, Ez) positioned around the said scalar magnetometer, the axes of these conductor coils (Ex, Ey, Ez) being orientated in different directions (Ox, Oy, Oz), means for powering each coil with a current with a determined frequency (Fx, Fy, Fz) specific to this coil, processing means (70) that receive the signal provided by the scalar magnetometer (2), and processing this signal to deduce the value of the continuous component along each of the axes of the coils, device characterised in that at least one of the means (Gx, Gy, Gz) that power each coil (Ex, Ey, Ez) with a current of a determined frequency (Fx, Fy, Fz) specific to each coil, produce at this frequency signals in phase and in quadrature, in that the processing means (70) which receive the signal provided by the scalar magnetometer (2) are capable of carrying out, apart from a synchronous demodulation in phase at least at the frequencies (Fx, Fy, Fz) powering the coils, a demodulation in quadrature for at least one of the frequencies (Fx, Fy, Fz) of the currents powering the coils (Ex, Ey, Ez), these demodulation means receiving, apart from the signal in phase generated by the power supply of the coils (Ex, Ey, Ez), the signal in quadrature from the generation means (Gx, Gy, Gz) and finally in that these processing means (70) include a calculation module (34) that provides, based on the results of the different demodulations, for each frequency, a signal corresponding to the corrected component (Bxc, Byc, Bzc) of the magnetic field applied along the axis (Ox, Oy, Oz) of the coil (Ex, Ey, Ez) powered at this frequency.

2. Precision device (1) for measuring the components of the magnetic field of claim 1, in which the axes (Ox, Oy, Oz) of the conductor coils (Ex, Ey, Ez) form an orthonormal reference or close to an orthonormal reference.

3. Device (1) of claim 2, comprising three conductor coils (Ex, Ey, Ez) at mutually orthogonal axes (Ox, Oy, Oz).

4. Device (1) of claim 1, in which the generation means (Gx, Gy, Gz) that power each coil (Ex, Ey, Ez) with a current of a determined frequency (Fx, Fy, Fz) specific to this coil are equipped with a quarter wave delay (31–33) whose output is coupled to a detection means (D'x, D'y, D'z).

5. Device (1) of claim 2, in which the generation means (Gx, Gy, Gz) that power each coil (Ex, Ey, Ez) with a current of a determined frequency (Fx, Fy, Fz) specific to this coil are equipped with a quarter wave delay (31–33) whose output is coupled to a detection means (D'x, D'y, D'z).

6. Device (1) of claim 3, in which the generation means (Gx, Gy, Gz) that power each coil (Ex, Ey, Ez) with a current of a determined frequency (Fx, Fy, Fz) specific to this coil are equipped with a quarter wave delay (31–33) whose output is coupled to a detection means (D'x, D'y, D'z).

7. Device (1) of claim 3, in which the processing means (70) have a number of synchronous detection means equal to the total number of signal generators and the number of quarter wave delays (31–33) equipping the said signal generators.

8. Process for measuring the components of a magnetic field along the axes (Ox, Oy, Oz), orientated in different directions, obtained using a device using a scalar magnetometer providing an output signal corresponding to the module B, of an applied magnetic field, the process consisting of superposing on the magnetic field to be measured, fields that are each orientated along each of the axes (Ox, Oy, Oz) respectively, these superposed fields varying in time periodically according to a frequency (Fx, Fy, Fz) that is specific to each axis, and then synchronously demodulating at each of the frequencies (Fx, Fy, Fz) the signal emitted from the scalar magnetometer and processing the signal resulting from a synchronous demodulation at one frequency, in order to deduce the value of the continuous component of the magnetic field along the axis receiving the superposed field at this frequency, a process characterised in that for at least one of the axial directions, the demodulation is carried out synchronously in phase and in quadrature for at least one of the superposed fields, and in that from the demodulation results at least one transfer function of the magnetometer is directly calculated for one of the frequencies at which a periodic field was superposed at this frequency, and possibly indirectly one or two transfer functions from a transfer function obtained directly and in that the value of the module of each component is corrected by application of one of the transfer functions calculated directly or indirectly.

9. Process for measuring the components of a magnetic field of claim 8 in which, based on the demodulation results in phase and in quadrature, a transfer function per modulation frequency is calculated directly and in which the calculated transfer function is applied for each of the modulation frequencies respectively for the correction of the component of the magnetic field corresponding to this modulation frequency.

10. Process for measuring the components of a magnetic field of claim 8 in which;

the uncorrected components of the magnetic field are calculated;

a comparison is made of the components to determine which is the largest;

the correction is made by applying to each axial component the transfer function corresponding to the frequency modulation applied to the coil along the axis of this axial component, the transfer function of the largest component being obtained directly from the demodulation results, and the transfer function of the other components being obtained indirectly from the transfer function of the largest component.

11. Process for measuring the components of a magnetic field of claim 8 in which:

the uncorrected components of the magnetic field are calculated;

the value of each of the components is compared to a threshold value;

a comparison is made of the components to determine which is the largest;

the correction is then made to each of the components above the threshold by applying the transfer function corresponding to the frequency relative to this component, obtained directly, and the components below the threshold are corrected by applying a transfer function obtained indirectly from the transfer function of the largest component.

12. Process for measuring the components of a magnetic field of claim 8 in which the components of the magnetic field are recalculated based on axial components corrected in a fictitious exactly orthonormal axis system, one of the fictitious axes coinciding with one of the coil axes.

13. Process for measuring the components of a magnetic field of claim 9 in which the components of the magnetic field are recalculated based on axial components corrected in a fictitious exactly orthonormal axis system, one of the fictitious axes coinciding with one of the coil axes.

14. Process for measuring the components of a magnetic field of claim 10 in which the components of the magnetic field are recalculated based on axial components corrected in a fictitious exactly orthonormal axis system, one of the fictitious axes coinciding with one of the coil axes.

15. Process for measuring the components of a magnetic field of claim 11 in which the components of the magnetic field are recalculated based on axial components corrected in a fictitious exactly orthonormal axis system, one of the fictitious axes coinciding with one of the coil axes.

* * * * *